US012769911B2

(12) United States Patent
Chen et al.

(10) Patent No.: US 12,769,911 B2
(45) Date of Patent: Oct. 20, 2026

(54) SYSTEMS AND METHODS FOR IMPLEMENTING DESIGN OF SEMICONDUCTOR PACKAGES

(71) Applicant: Taiwan Semiconductor Manufacturing Company, Ltd., Hsinchu (TW)

(72) Inventors: Ching-Fang Chen, Hsinchu (TW); Ang-Chih Hsieh, Hsinchu (TW); Wei-Heng Lo, Hsinchu (TW); Heng-Yi Lin, Hsinchu (TW); Chih-Wei Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 647 days.

(21) Appl. No.: 18/454,267

(22) Filed: Aug. 23, 2023

(65) Prior Publication Data

US 2025/0068811 A1 Feb. 27, 2025

(51) Int. Cl.

| | |
|---|---|
| ***G06F 30/30*** | (2020.01) |
| ***G06F 30/327*** | (2020.01) |
| ***G06F 30/392*** | (2020.01) |
| ***G06F 30/398*** | (2020.01) |

(52) U.S. Cl.

CPC .......... *G06F 30/327* (2020.01); *G06F 30/392* (2020.01); *G06F 30/398* (2020.01)

(58) Field of Classification Search

USPC ................ 716/100, 101, 102, 103, 104, 106

See application file for complete search history.

(56) References Cited

U.S. PATENT DOCUMENTS

| | | | | |
|---|---|---|---|---|
| 9,619,600 | B2 | 4/2017 | Selvidge et al. | |
| 10,031,994 | B1 * | 7/2018 | Liu | G06F 30/392 |
| 10,839,118 | B1 * | 11/2020 | Chandrasekar | G06F 30/392 |

(Continued)

FOREIGN PATENT DOCUMENTS

| | | |
|---|---|---|
| TW | 202307720 A | 2/2023 |

OTHER PUBLICATIONS

Office Action issued in connection with Taiwan Appl. No. 113115163 dated Sep. 27, 2024.

*Primary Examiner* — Brian Ngo
(74) *Attorney, Agent, or Firm* — Foley & Lardner LLP

(57) ABSTRACT

An integrated circuit design implementation system includes a synthesis tool configured to: receive a behavioral description of each of a plurality of first components; generate first netlists based on the behavioral descriptions of the first components; receive connection information of a plurality of second components, wherein the connection information comprises physical arrangement and connectivity among the first components and the second components; generate a plurality of third components, wherein each of the third components operatively corresponds to an interface between a pair of one of the first components and one of the second components; and transform the first netlists to a second netlist based on first vertices, second vertices, third vertices, and edges. The first vertices correspond to the first components, respectively, the second vertices correspond to the second components, respectively, and the third vertices correspond to the third components, respectively.

20 Claims, 10 Drawing Sheets

(56) References Cited

U.S. PATENT DOCUMENTS

| | | | | |
|---|---|---|---|---|
| 2014/0001564 | A1 | 1/2014 | Song et al. | |
| 2017/0103156 | A1* | 4/2017 | Gupta | G06F 30/34 |
| 2023/0186007 | A1 | 6/2023 | Lee et al. | |

* cited by examiner

SYSTEMS AND METHODS FOR IMPLEMENTING DESIGN OF SEMICONDUCTOR PACKAGES

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-nanometer node), which allows more components to be integrated into a given area. As the demand for miniaturization, higher speed, and greater bandwidth, as well as lower power consumption and latency has grown recently, there has grown a need for advanced packaging techniques for semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
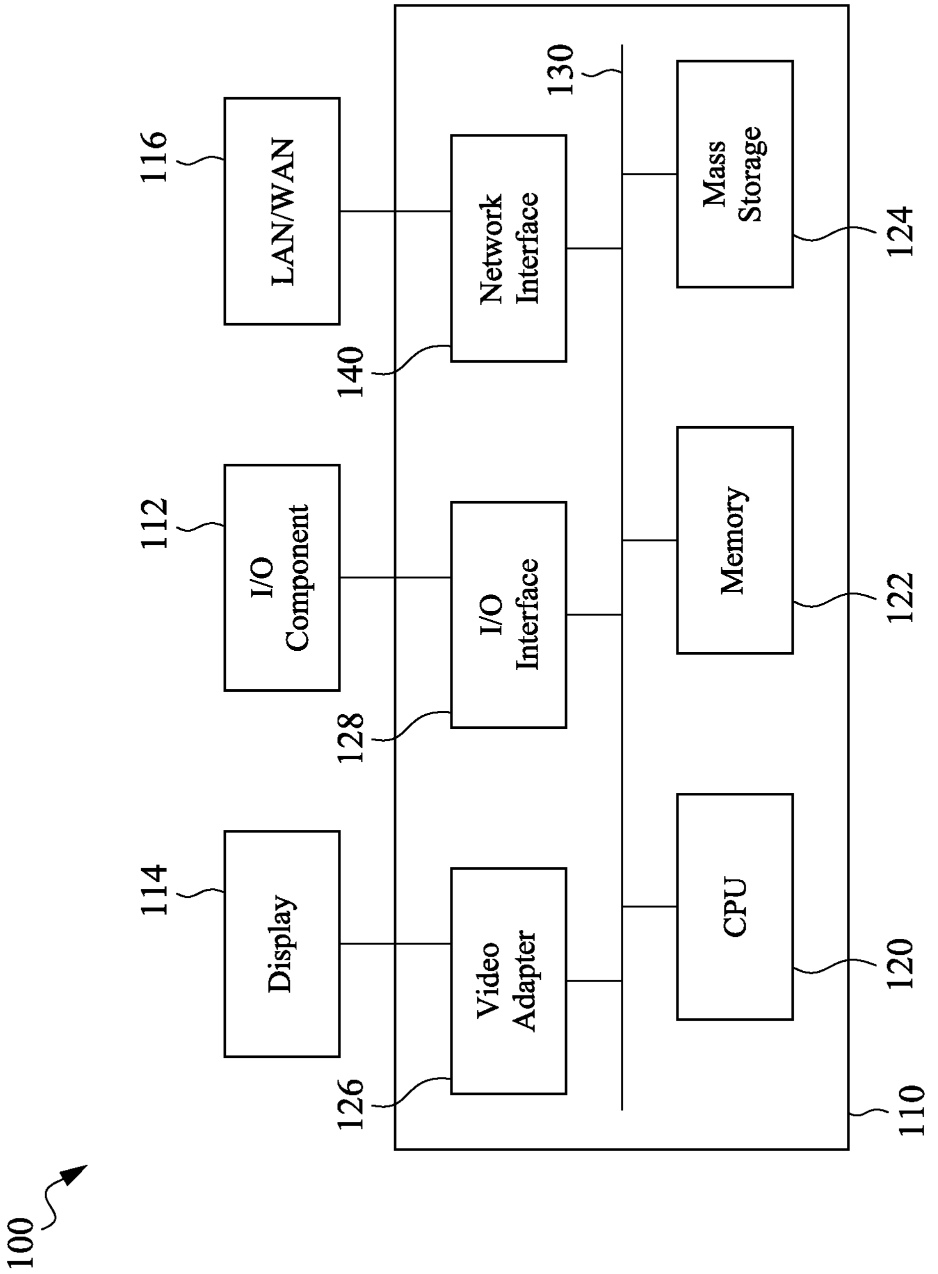
FIG. 1 illustrates a block diagram of a processing system, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with increasingly advanced technology nodes, the design of integrated circuits seem to no longer begin with a circuit diagram. Typically, a circuit design starts with a high-level description or representation of the logic functions required for a new circuit. These logic function definitions are often described using a hardware description language ("HDL") (e.g., a System Verilog, Verilog, VHDL, or other register-transfer level ("RTL") description) or even using an algorithmic description (e.g., a C++, SystemC, or other algorithmic description). This functional description is utilized to generate a lower-level description or representation of the circuit that describes how the desired functionality is to be implemented. This lower-level representation is typically a gate-level netlist, such as a mapped netlist. Furthermore, the mapped netlist may then be placed and routed, thereby generating a placed and routed netlist. The process of generating a lower-level circuit description or representation (such as a gate-level netlist) from a high-level description of logic function (such as an RTL or algorithmic description) is referred to as "synthesis." Accordingly, a software application used to generate a lower-level circuit description or representation from a high-level description of logic function is referred to as a "synthesis tool."

A modern semiconductor device may be formed as a semiconductor package that includes a plural number of semiconductor chips, or integrated circuit (IC) chips, operatively and physically coupled to one another. Various technologies are utilized to integrate multiple IC chips into a single semiconductor package. Examples of semiconductor packages include a chip on wafer on substrate (CoWoS) package, an Integrated Fan-Out (InFo) package, a three-dimensional integrated circuit (3D IC) package, or the like. In a semiconductor package, different IC chips (e.g., with logic functionality) are typically coupled to each other through one or more connection structures (e.g., without logic functionality). In the existing technologies, simulating and/or verifying such a semiconductor package typically requires a significant amount of human efforts. For example, after separately synthesizing lower-level circuit descriptions for the different IC chips, physical arrangement and operative connection of the connection structures with respect to the IC chips are manually configured for (e.g., inserted into) the synthesized lower-level circuit description. This manual efforts disadvantageously complicate the design and corresponding verification on a semiconductor package. Thus, the existing technologies to design a semiconductor package have not been entirely satisfactory in some aspects.

The present disclosure provides various embodiments of an integrated circuit design implementation system that can automatically generate a netlist based on the design of a semiconductor package, and methods for operating the same. For example, the integrated circuit design implementation system can include a synthesis tool configured to receive a behavioral description of each of a plural number of IC chips of a semiconductor package, and generate a number of first netlists based on the behavioral descriptions of the IC chips. The synthesis tool can further receive connection information of a plural number of connection structures of the semiconductor package. In some embodiments, the connection information can configure overall physical arrangement and connectivity among the IC chips and the connection structures. Based on the connection information, the synthesis tool can generate a plural number of virtual interfaces each inserted between any two of the IC chips and/or the connection structures. In response, the synthesis tool can automatically convert the IC chip, the connection structures, and the virtual interfaces into first vertices, second vertices, and third vertices, respectively, and connect those vertices with edges, thereby forming a unique graph for this semiconductor package. According to the graph, the synthesis tool can update the first netlists as a second netlist, which can be utilized to simulate and/or verify the designed semiconductor package. In this way, the system, as disclosed herein, can significantly help to reduce time and efforts for designing a semiconductor package.

FIG. 1 illustrates a block diagram of a processing system 100 provided in accordance with various embodiments of the present disclosure. The processing system 100 can be used to implement any or all of the processes, steps, or operations discussed herein. The processing system 100 may include a processing tool 110, such as a desktop computer, a workstation, a laptop computer, or a dedicated unit customized for a particular application. The processing system 100 may be equipped with a display 114 and one or more input/output devices 112, such as a mouse, a keyboard, or printer. The processing tool 110 may include a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may include any type of electronic data processor, and the memory 122 may comprise any type of system memory, such as static random access memory (SRAM), dynamic random access memory (DRAM), or read-only memory (ROM).

The mass storage device 124 may include any type of storage device configured to store data, programs, and other information and to make the data, programs, and other information accessible via the bus 130. The mass storage device 124 may include, for example, one or more of a hard disk drive, a magnetic disk drive, an optical disk drive, or the like.

The video adapter 126 and the I/O interface 128 provide interfaces to couple external input and output devices to the processing tool 110. As illustrated in FIG. 1, examples of input and output devices include the display 114 coupled to the video adapter 126 and the I/O device 112, such as a mouse, keyboard, printer, and the like, coupled to the I/O interface 128. Other devices may be coupled to the processing tool 110, and additional or fewer interface cards may be utilized. For example, a serial interface card (not shown) may be used to provide a serial interface for a printer. The processing tool 110 also may include a network interface 140 that may be a wired link to a local area network (LAN) or a wide area network (WAN) 116 and/or a wireless link.

It should be noted that the processing system 100 may include other components. For example, the processing system 100 may include power supplies, cables, a motherboard, removable storage media, cases, and the like. These other components, although not shown, are considered part of the processing system 100.

In various embodiments of the present disclosure, an electronic design automation (EDA) is program code that is executed by the CPU 120 to automatically generate a netlist based on the design of a semiconductor package (described further below with respect to FIG. 2). Further, during the execution of the EDA, the EDA may provide various analysis and/or verification on the semiconductor package based on a layout of the automatically generated netlist. The program code may be accessed by the CPU 120 via the bus 130 from the memory 122, mass storage device 124, or the like, or remotely through the network interface 140.

Figure 2:
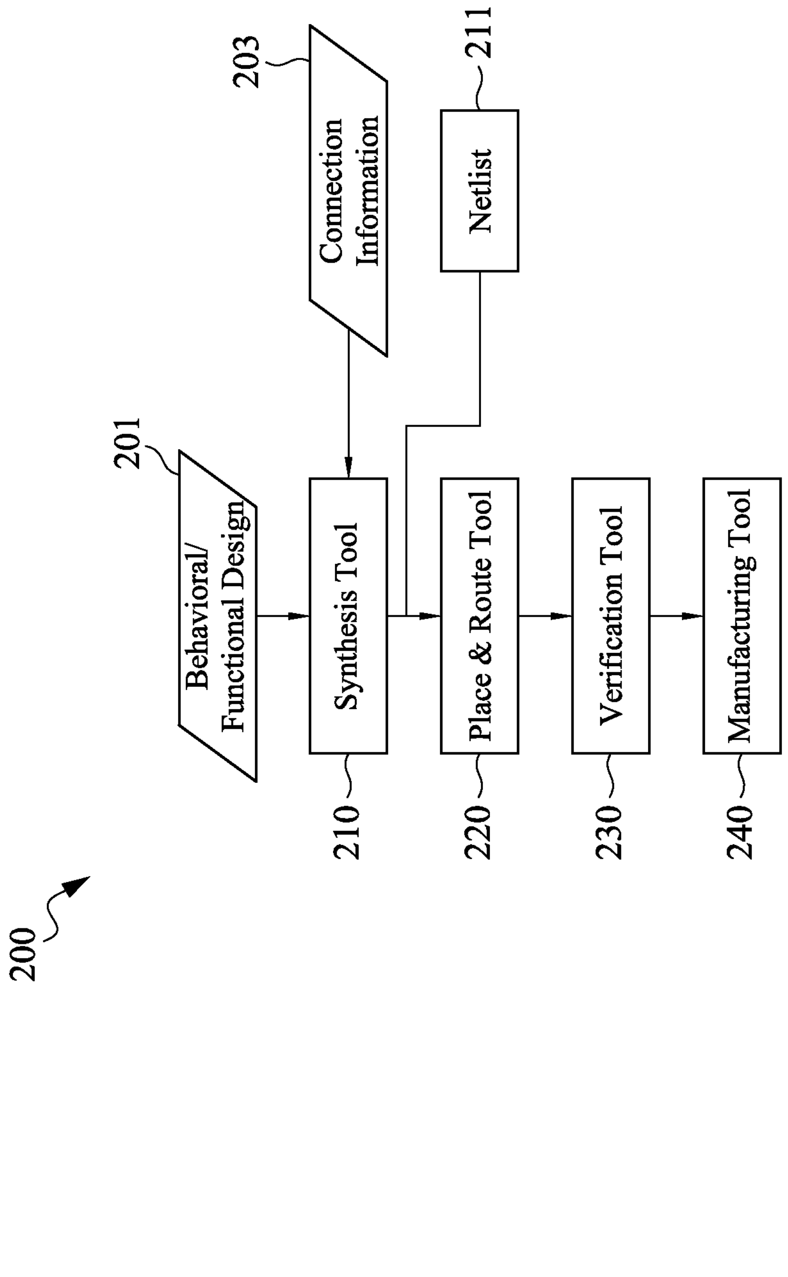
FIG. 2 illustrates a flow of an example method used by an electronic design automation (EDA), in accordance with some embodiments.

FIG. 2 illustrates a flow of an example method 200 used by the disclosed EDA in an embodiment of the present disclosure to automatically generate or update a netlist based on the design of a semiconductor package based on user-supplied/specified behavioral/functional design 201 and connection information 203. In various embodiments of the present disclosure, the semiconductor package includes a plural number of IC chips (hereinafter "logic chips") and a plural number of connection structures ("non-logic structures"). Specifically, the logic chips can each present one or more logic and/or analog functions, while the non-logic structures can each provide one or more electrical connection functions for corresponding ones of the logic chips.

For example, the behavioral/functional design 201 can specify the desired behavior or function of the logic chips based upon various signals or stimuli applied to inputs of the overall design, and may be written in a suitable language, such as a hardware description language (HDL). The behavioral/functional design 201 may be uploaded into the processing tool 110 (see FIG. 1) through the I/O interface 128, such as by a user creating the file while the EDA is executing. Alternatively, the behavioral/functional design 201 may be uploaded and/or saved on the memory 122 or mass storage device 124, or the behavioral/functional design 201 may be uploaded through the network interface 140 from a remote user (see FIG. 1). In these instances, the CPU 120 will access the behavioral/functional design 201 during execution of the EDA.

The connection information 203 can specify physical arrangement and connectivity among the logic chips and the non-logic structures, in accordance with various embodiments of the present disclosure. For example, the connection information 203 can include how the logic chips are physically arranges with one another, e.g., side-by-side, on top of one another, or combinations thereof. In another example, the connection information 203 can include how different ones of the logic chips are electrically coupled to each other. Based on the techniques to form the semiconductor package, the non-logic structures can include any of various structures that can provide electrical connection function and/or mechanical support. Examples of the non-logic structures include a physical substrate (e.g., a printed circuit board (PCB), a chip scale package (CSP) substrate), a physical redistribution layer (RDL), and a physical interposer (e.g., a silicon interposer, an organic interposer, etc.). Similar to the behavioral/functional design 201, the connection information 203 may be uploaded into the processing tool 110 (see FIG. 1) through the I/O interface 128, such as by a user creating the file while the EDA is executing. Alternatively, the connection information 203 may be uploaded and/or saved on the memory 122 or mass storage device 124, or the connection information 203 may be uploaded through the network interface 140 from a remote user (see FIG. 1). In these instances, the CPU 120 will access the connection information 203 during execution of the EDA.

The EDA can take the behavioral/functional design 201 and the connection information 203, and perform a synthesis, e.g., by a synthesis tool 210, to generate a netlist, e.g., netlist 211. In a brief overview, the synthesis tool 210 can first form a number of functionally equivalent logic gate-level circuit descriptions (hereinafter "first netlists") corresponding to the logic chips, respectively, based on the behavioral/functional design 201. It should be noted that such first netlists can each represent a gate-level description for the corresponding individual logic chip. Next, the synthesis tool 210 can transform the first netlists to the netlist 211 (hereinafter "second netlist"), which includes how the logic chips are physically arranged and operatively communicated with each other through the non-logic structures, based on the connection information 203. The synthesis tool 210 can generate the second netlist based on a graph, including a number of vertices connected to one another through corresponding ones of edges, which will be discussed as follows.

According to various embodiments of the present disclosure, while generating the first netlists (for the logic chips), the synthesis tool 210 can convert the logic chips into a number of first vertices, respectively. Next, upon receiving the connection information 203 (specifying the non-logic structures), the synthesis tool 210 can convert the non-logic structures into a number of second vertices, respectively. For example, the synthesis tool 210 may arrange the second vertices and the first vertices according to the physical arrangement specified in the connection information 203. Next, the synthesis tool 210 can generate a number of third vertices, each of which corresponds to a virtual interface between any two of the logic chips and the non-logic structures. Next, the synthesis tool 210 can connect two of the first vertices, second vertices, and/or third vertices through a number of edges. For example, the synthesis tool 210 may generate or otherwise configured such edges according to the connectivity (among the logic chips and the non-logic structures) specified in the connection information 203. As a result, a graph consisting of the first vertices, second vertices, third vertices, and edges can be formed. The synthesis tool 210 can determine this graph uniquely corresponding to the semiconductor package. As a result, the synthesis tool 210 can automatically transform the first netlists as the second netlist 211.

In some embodiments, the synthesis tool 210 can provide the second netlist 211 to a place and route tool 220. Based on the second netlist 211, the place and route tool 220 can create an actual physical design for the overall structure (e.g., the semiconductor package). The place and route tool 220 can form the physical design by taking chosen cells from cell libraries and placing them into cell rows. These cell rows generally have a row height similar to the height of a majority of the individual cells located within that cell row such that the power rails, implants and wells may be aligned between the individual cells. The placement of each individual cell within the cell rows, and the placement of each cell row in relation to other cell rows, may be guided by cost functions in order to minimize wiring lengths and area requirements of the resulting integrated circuit. This placement may be done either automatically by the place and route tool 220, or else may alternatively be performed partly through a manual process, whereby a user may manually insert one or more cells into a row.

Once the placement and route tool 220 finishes generating the actual physical design for the overall structure, a verification tool 230 can provide a physical verification of the semiconductor package. The physical verification generally includes a timing verification, a design rule check (DRC), a layout versus schematic (LVS) analysis, and an electrical rule check (ERC). Once the physical verification is completed with satisfactory results, the design of the semiconductor package can be sent to a manufacturing tool 240 to generate, e.g., photolithographic masks, that may be used in the physical manufacture of the desired design. The design may be sent to the manufacturing tool 240 through that LAN/WAN 116 (FIG. 1) or other suitable forms of transmission from the EDA to the manufacturing tool 240.

Figure 4:
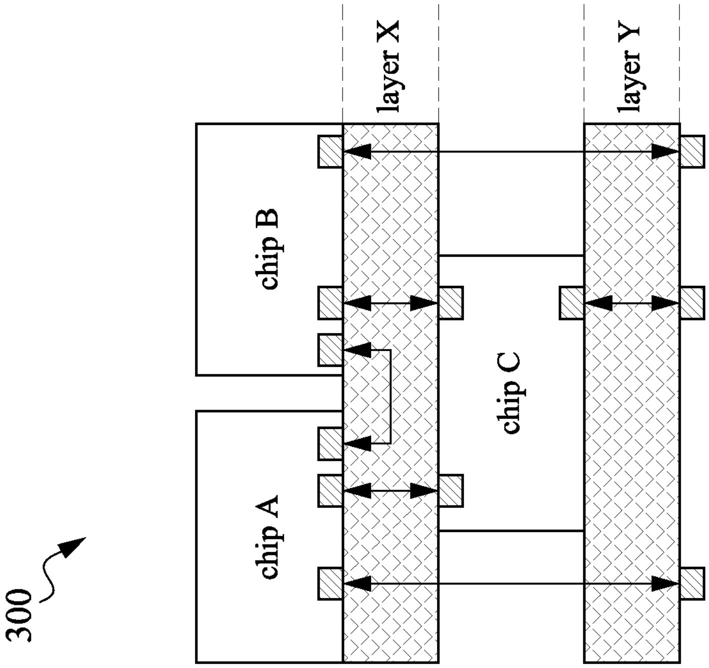
FIGS. 3 and 4 illustrate an example semiconductor package, in accordance with some embodiments.
Figure 3:
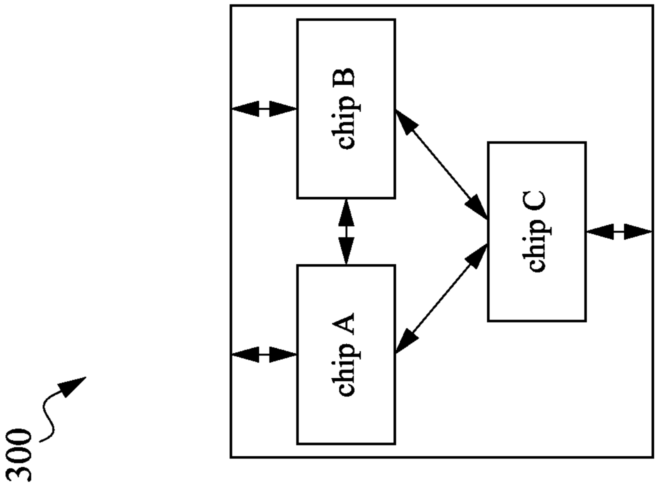
Figure 5:
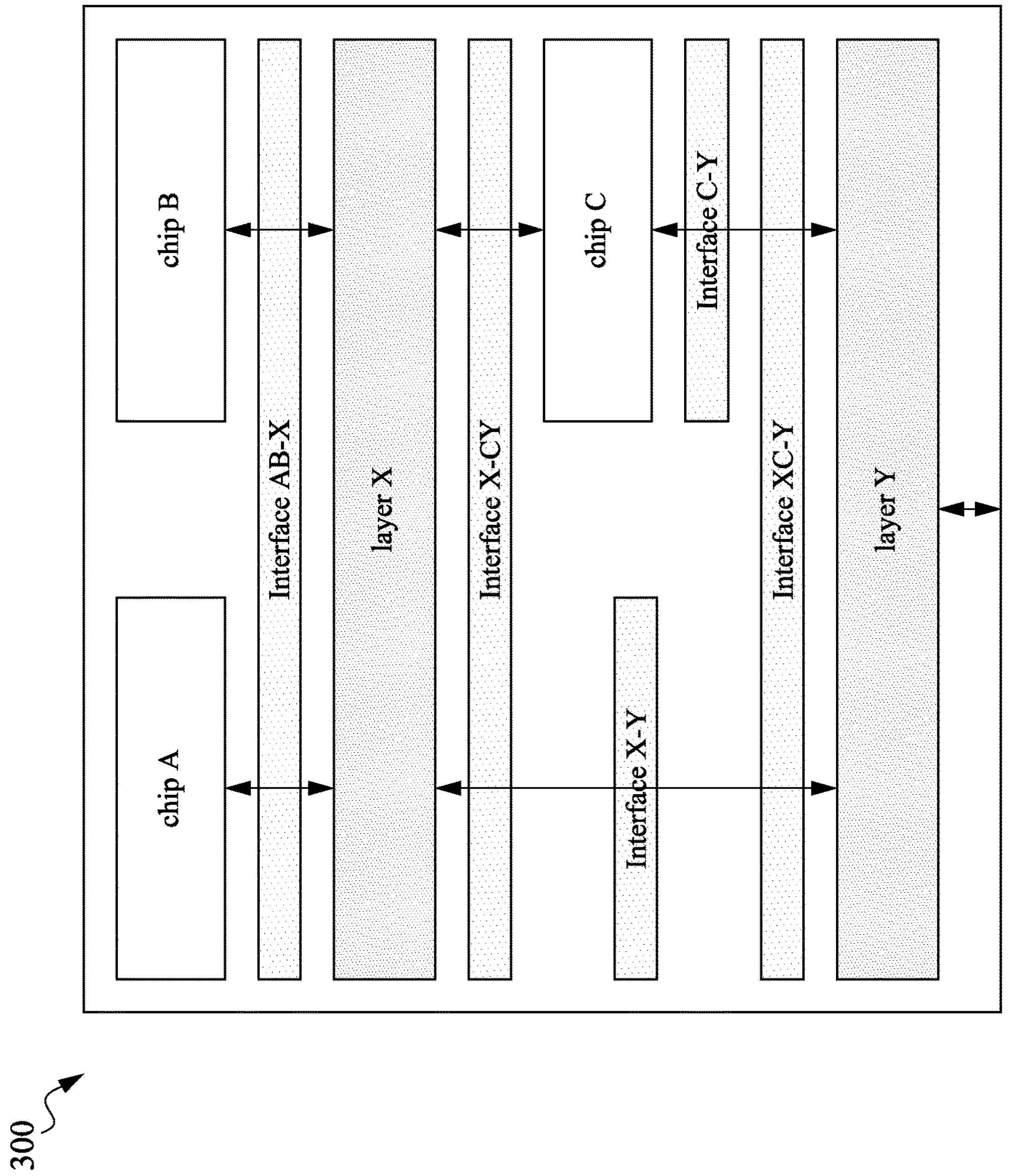
FIG. 5 illustrates a graph uniquely created based on the semiconductor package shown in FIGS. 3-4, in accordance with some embodiments.

FIG. 3 illustrates a schematic diagram of a top view of an example semiconductor package 300, FIG. 4 illustrates a schematic diagram of a cross-sectional view of the example semiconductor package 300 with a number of physical structures, and FIG. 5 illustrates a schematic diagram of another cross-sectional view of the example semiconductor package 300 with the physical structures together with a number of virtual structures, in accordance with various embodiments of the present disclosure.

Referring first to the top view of FIG. 3, the semiconductor package 300 includes three physical chip A, chip B, and chip C. The chips A to C may each be an implementation of the logic chip, as currently disclosed herein. For example, each of the chips A to C can present a respective (e.g., logic and/or analog) function. In some embodiments of the present disclosure, the respective functions of the chips A to C may be specified in the behavioral/functional design 201 (FIG. 2). Referring next to the cross-sectional view of FIG. 4, the semiconductor package 300 further includes two physical layer X and layer Y. The layers X and Y may each be an implementation of the non-logic structure, as currently disclosed herein. For example, each of the layers X and Y can present a respective connection function. In some embodiments of the present disclosure, how the layers X and Y are physically arranged with respect to the chips A to C, and how the layers X and Y are operatively coupled to the chips A to C may be specified in the connection information 203 (FIG. 2). Referring next to the cross-sectional view of FIG. 5, the semiconductor package 300 further includes five virtual interfaces, each of which is configured to operatively couple two or more of the chips A to C and layers X to Y. The synthesis tool 210 may generate such virtual interfaces based on the connection information 203. For example in FIG. 5, the synthesis tool 210 can generate interface AB-X between the chip A and the layer X, and between the chip B and the layer X; interface X-CY between the layer X and the layer Y through the chip C; interface X-Y between the layer X and the layer Y; interface C-Y between the chip C and the layer Y; and interface XC-Y between the layer X and the layer Y through the chip C. The synthesis tool 210 can convert these physical structures (e.g., chips A-C and layers X-Y) and virtual interfaces (interfaces AB-X, X-CY, X-Y, C-Y, and XC-Y) into a graph, and generate the netlist 211 according to such a graph, which will be described in the following examples of FIGS. 6-8 and FIG. 9-11.

Figure 6:
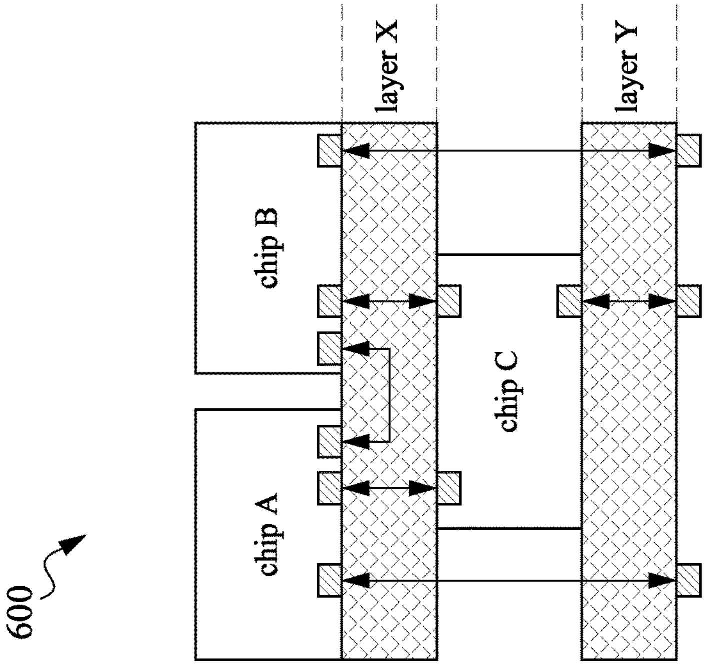
FIGS. 6 and 7 illustrate another example semiconductor package, in accordance with some embodiments.
Figure 7:
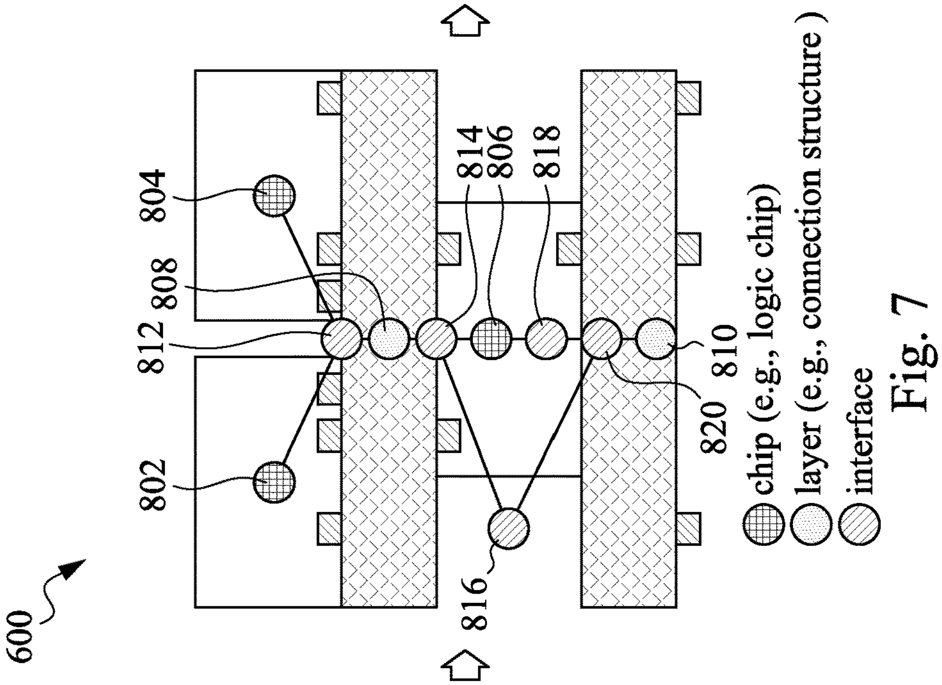
Figure 8:
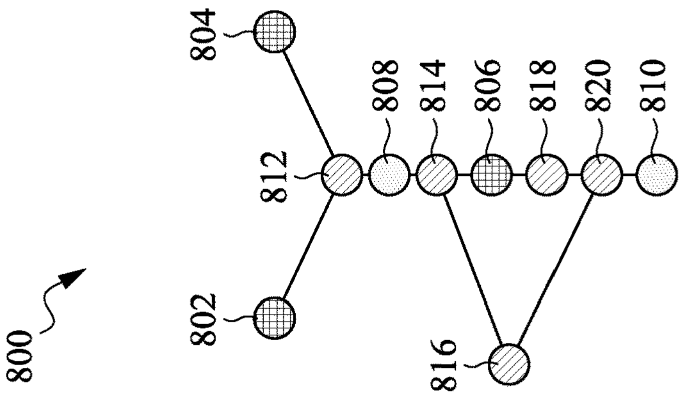
FIG. 8 illustrates a graph uniquely created based on the semiconductor package shown in FIGS. 6-7, in accordance with some embodiments.

In the illustrated embodiment of FIG. 6-8, a semiconductor package 600, having chips A, B, and C that are physically arranged with respect to each other and operatively coupled to each other through layers X and Y, is shown in FIG. 6. The chips A to C may each be an implementation of the logic chip, and the layers X to Y may each be an implementation of the non-logic structure, as currently disclosed herein. Upon receiving the information regarding how the chips A-C and layers X-Y are arranged and coupled to each other, the synthesis tool 210 can generate a number of interfaces, as discussed above in FIGS. 3-5. Next, the synthesis tool 210 can covert the chips A-C and layers X-Y to vertices 802, 804, 806, 808, and 810, respectively, and convert the interfaces AB-X, X-CY, X-Y, C-Y, and XC-Y to vertices 812, 814, 816, 818, and 820, respectively, as shown in FIG. 7. After generating the vertices for both of the physical structures and virtual interfaces (e.g., 802 to 820), the synthesis tool 210 can connect those vertices with edges based on the connections among the chips A-C and layers X-Y, and generate a graph 800 shown in FIG. 8.

For example, the chip A is coupled to the chip C through the layer X (FIG. 6). In operation, the chip A may be coupled to the layer X via a first interface and the layer X is coupled to the chip C via a second interface, which resulting in forming the vertex 802, corresponding to the chip A, that is coupled to the vertex 808, corresponding to the layer X, through the vertex 812, corresponding to the first interface (e.g., the interface AB-X in FIG. 5), and further forming the vertex 806, corresponding to the chip C, that is coupled to the vertex 808 through the vertex 814, corresponding to the second interface (e.g., the interface X-CY in FIG. 5). In another example, the chip B is coupled to the chip C through the layer X (FIG. 6). In operation, the chip B may be coupled to the layer X via a first interface and the layer X is coupled to the chip C via a second interface, which resulting in forming the vertex 804, corresponding to the chip B, that is coupled to the vertex 808, corresponding to the layer X, through the vertex 812, corresponding to the first interface (e.g., the interface AB-X in FIG. 5), and further forming the vertex 806, corresponding to the chip C, that is coupled to the vertex 808 through the vertex 814, corresponding to the second interface (e.g., the interface X-CY in FIG. 5). In yet another example, the chip A is coupled to the layer Y through the layer X (FIG. 6). In operation, the chip A is coupled to the layer X via an interface, and the layer X is directly (without any physical structure interposed therebetween) coupled to the layer Y via a number of interfaces that detour the chip C, which results in forming the vertex 816, corresponding to the interface X-Y, that is disconnected from the vertex 806, corresponding to the chip C. In yet another example, the chip B is coupled to the layer Y through the layer X (FIG. 6). In operation, the chip B is coupled to the layer X via an interface, and the layer X is directly (without any physical structure interposed therebetween) coupled to the layer Y via a number of interfaces that detour the chip C, which results in forming the vertex 816, corresponding to the interface X-Y, that is disconnected from the vertex 806, corresponding to the chip C.

Figure 9:
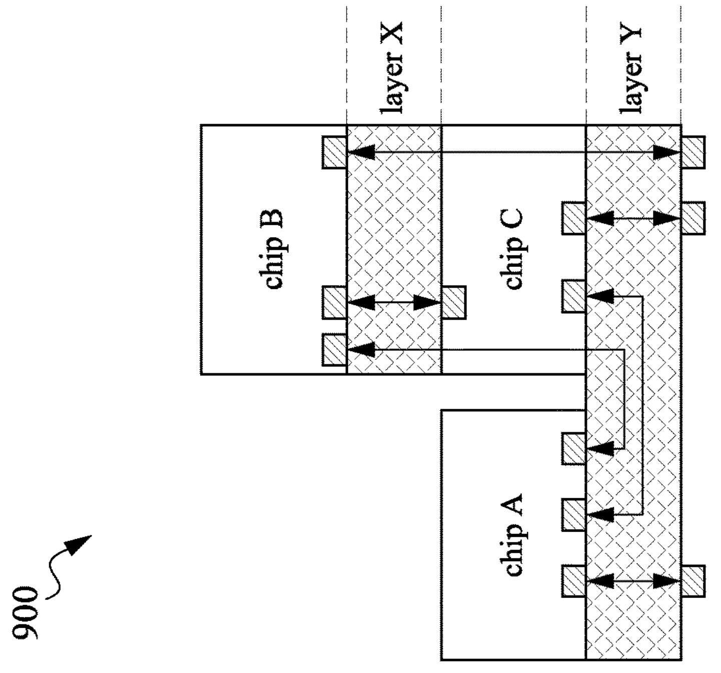
FIGS. 9 and 10 illustrate yet another example semiconductor package, in accordance with some embodiments.
Figure 10:
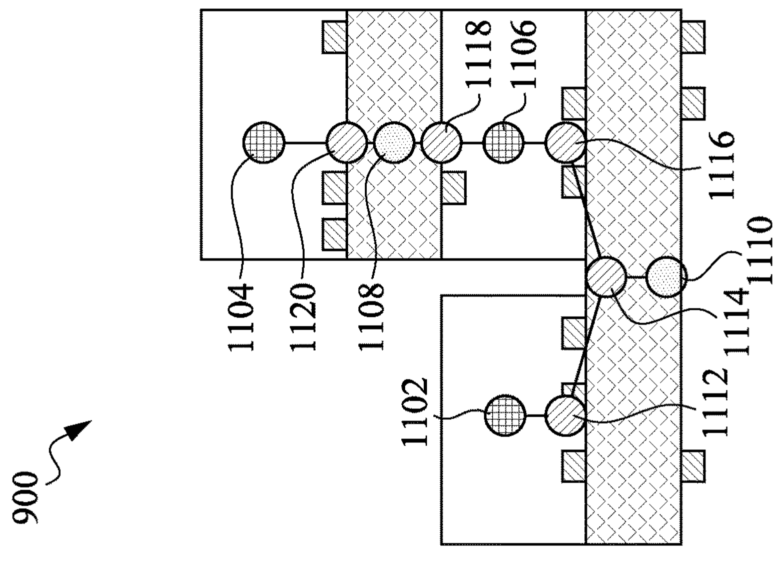
Figure 11:
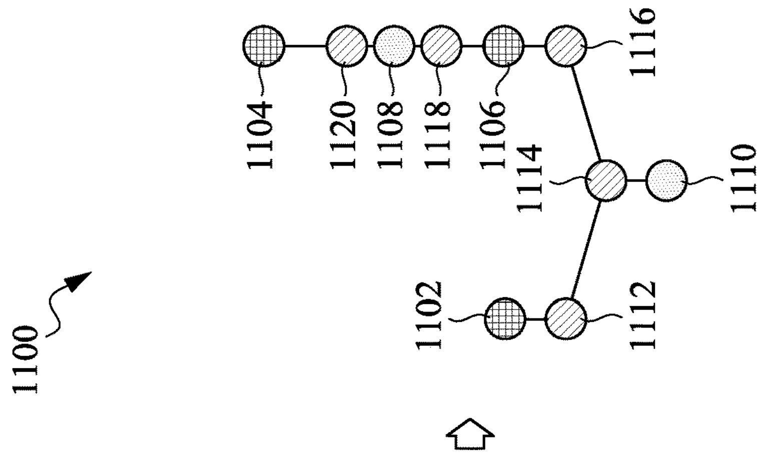
FIG. 11 illustrates a graph uniquely created based on the semiconductor package shown in FIGS. 9-10, in accordance with some embodiments.

In the illustrated embodiment of FIG. 9-11, a semiconductor package 900, having chips A, B, and C that are physically arranged with respect to each other and operatively coupled to each other through layers X and Y, is shown in FIG. 9. The chips A to C may each be an implementation of the logic chip, and the layers X to Y may each be an implementation of the non-logic structure, as currently disclosed herein. Upon receiving the information regarding how the chips A-C and layers X-Y are arranged and coupled to each other, the synthesis tool 210 can generate a number of interfaces, as discussed above in FIGS. 3-5. Next, the synthesis tool 210 can covert the chips A-C and layers X-Y to vertices 1102, 1104, 1106, 1108, and 1110, respectively, and convert interfaces operatively coupled between one or more of the chips A-C and layers X-Y to vertices 1112, 1114, 1116, 1118, and 1120, respectively, as shown in FIG. 10. After generating the vertices for both of the physical structures and virtual interfaces (e.g., 1102 to 1120), the synthesis tool 210 can connect those vertices with edges based on the connections among the chips A-C and layers X-Y, and generate a graph 1100 shown in FIG. 11.

For example, the chip A is coupled to the chip C through the layer Y (FIG. 9). In operation, the chip A may have a first interface coupled to a second interface of the layer Y, and the layer Y may be coupled to the chip C via the second interface and a third interface of the chip C, which resulting in forming the vertex 1102, corresponding to the chip A, that is coupled to the vertex 1110, corresponding to the layer Y, through the vertices 1112 and 1114, corresponding to the first and second interfaces, respectively, and further forming the vertex 1116, corresponding to the third interface, and the vertex 1106, corresponding to the chip C. In another example, the chip B is coupled to the chip C through the layer Y (FIG. 9). In operation, the chip B may be coupled to the layer X through a first interface, and the layer X may be coupled to the chip C via a second interface, which results in forming the vertex 1104, corresponding to the chip B, that is coupled to the vertex 1108, corresponding to the layer X through the vertex 1120, corresponding to the first interface, and further forming the vertex 1118, corresponding to the second interface coupling the layer X to the chip C.

In some embodiments, the synthesis tool 210 (FIG. 2) can further receive power information, which includes one or more power/signal delivery paths among the logic chips (e.g., the chips A, B, and C) and the non-logic structures (e.g., the layers X and Y). Based on such power information, the synthesis tool 210 can annotate, modify, or otherwise update the graph. For example, one or more vertices in the graph, generated by the synthesis tool 210 based on the behavioral/functional design 201 and connection information 203, may be annotated to indicate one or more power/signal delivery paths. In this way, the updated netlist 211 (FIG. 2) can even more closely simulate performance of the corresponding semiconductor package.

Figure 13:
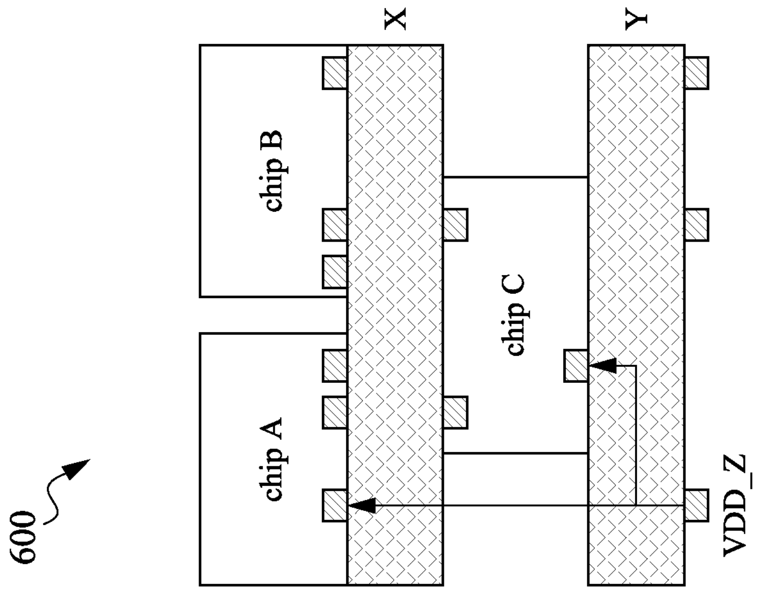
FIGS. 12, 13, and 14 illustrate various examples of power delivery paths present in a semiconductor package, in accordance with some embodiments.
Figure 12:
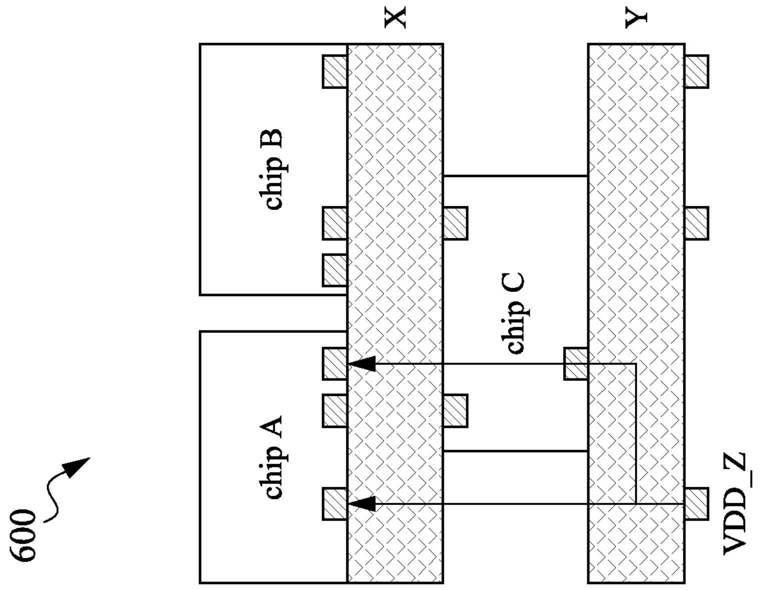
Figure 14:
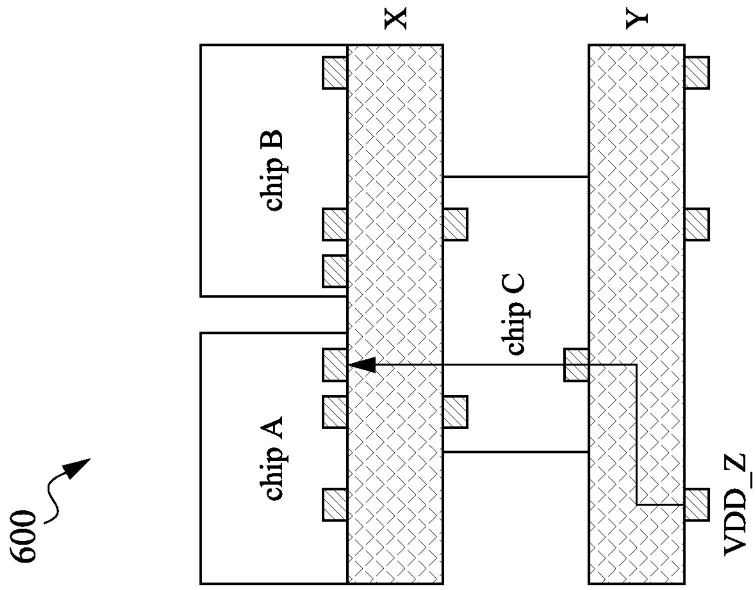
Figure 16:
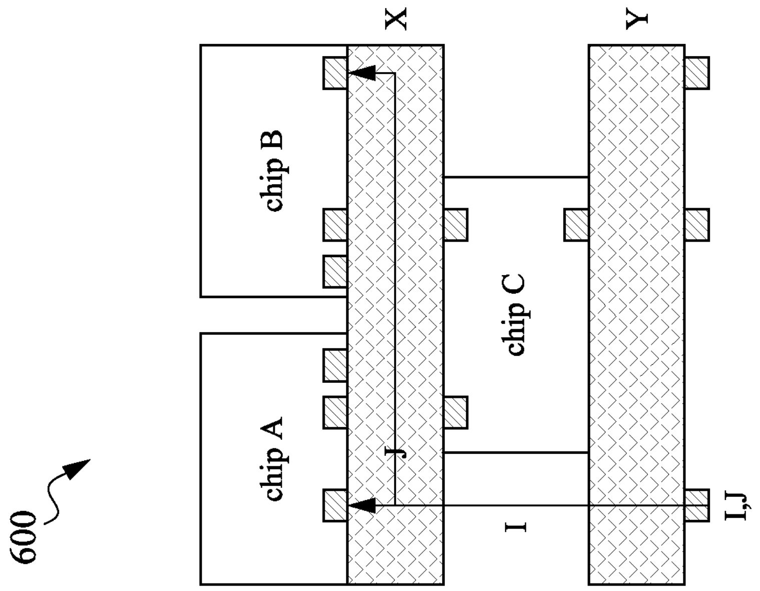
FIGS. 15 and 16 illustrate various examples of signal delivery paths present in a semiconductor package, in accordance with some embodiments.
Figure 15:
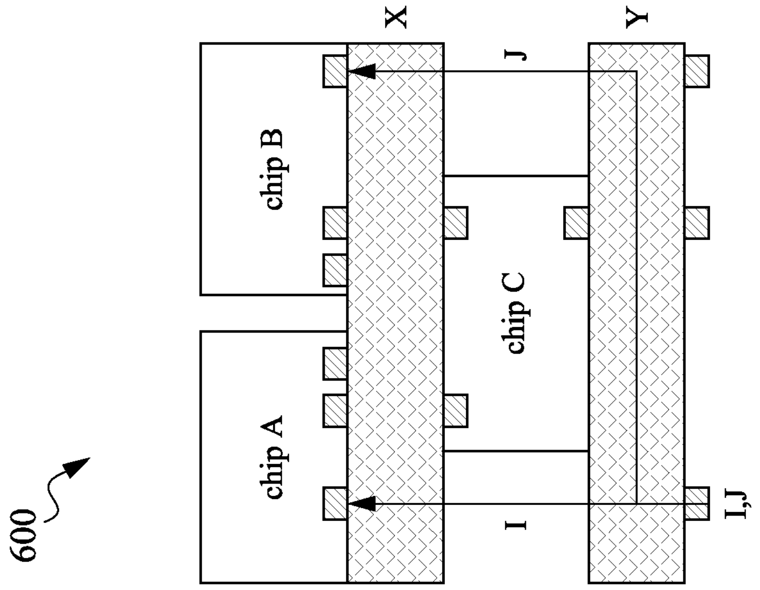

FIGS. 12, 13, and 14 illustrate various examples of the semiconductor package 600 (FIG. 6) having respective power delivery paths, and FIGS. 15 and 16 illustrate various examples of the semiconductor package 600 (FIG. 6) having respective signal delivery paths, in accordance with various embodiments of the present disclosure.

In FIG. 12, a power source (VDD_Z) is supplied to the semiconductor package 600 via two power delivery paths. Specifically, a first power delivery path includes receiving the power source from the layer Y and sending it to the chip A through the layer X, and a second power delivery path includes receiving the power source from the layer Y and sending it to the chip A through the chip C then through the layer X. In FIG. 13, a power source (VDD_Z) is supplied to the semiconductor package 600 via two power delivery paths. Specifically, a first power delivery path includes receiving the power source from the layer Y and sending it to the chip A through the layer X, and a second power delivery path includes receiving the power source from the layer Y and sending it to the chip C directly. In FIG. 14, a power source (VDD_Z) is supplied to the semiconductor package 600 via one power delivery path. Specifically, a power delivery path includes receiving the power source from the layer Y and sending it to the chip A through the chip C then through the layer X.

In FIG. 15, two signals (I and J) are supplied to the semiconductor package 600 via two signal delivery paths. Specifically, a first signal delivery path includes receiving the signal I from the layer Y and sending it to the chip A through the layer X, and a second signal delivery path includes receiving the signal J from the layer Y and sending to the chip B through the layer X. In FIG. 16, two signals (I and J) are supplied to the semiconductor package 600 via two signal delivery paths. Specifically, a first signal delivery path includes receiving the signal I from the layer Y and sending it to the chip A through the layer X, and a second signal delivery path includes receiving the signal J from the layer Y and sending to the chip B through the layer X.

Figure 17:
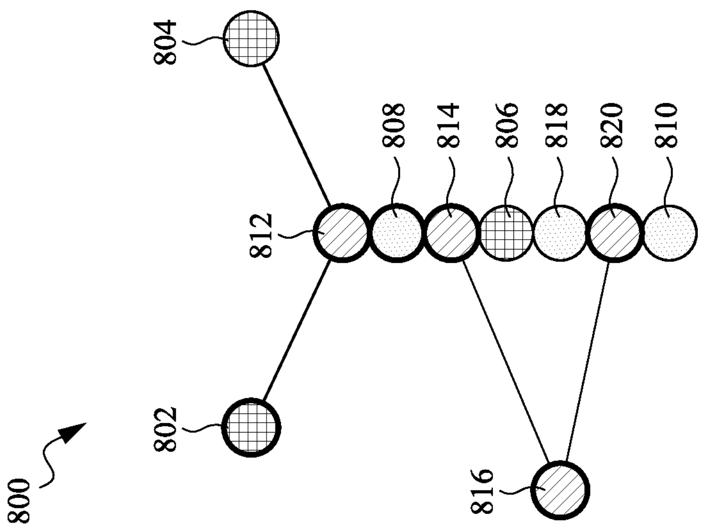
FIG. 17 illustrates a graph annotated based on the power/signal delivery path shown in FIGS. 12 to 16, in accordance with some embodiments.

FIG. 17 illustrates the graph 800 (FIG. 8) annotated based on at least one of the power/signal delivery paths of FIGS. 12-16, in accordance with various embodiments of the present disclosure. Using the first power delivery path shown in FIG. 12 (e.g., receiving the power source from the layer Y and sending it to the chip A through the layer X) as a representative example, the corresponding vertices 810, 812, 816, 814, 808, 812, and 802 may be annotated, as shown in FIG. 17.

In one aspect of the present disclosure, an integrated circuit design implementation system is disclosed. The system includes a synthesis tool configured to: receive a behavioral description of each of a plurality of first components; generate first netlists based on the behavioral descriptions of the first components; receive connection information of a plurality of second components, wherein the connection information comprises physical arrangement and connectivity among the plurality of first components and the plurality of second components; generate a plurality of third components, wherein each of the plurality of third components operatively corresponds to an interface between a pair of one of the first components and one of the second components; and transform the first netlists to a second netlist based on a plurality of first vertices, a plurality of second vertices, a plurality of third vertices, and a plurality of edges. The first vertices correspond to the first components, respectively, the second vertices correspond to the second components, respectively, and the third vertices correspond to the third components, respectively.

In another aspect of the present disclosure, a method for verifying a semiconductor package is disclosed. The method includes receiving a behavioral description of each of a plurality of logic chips; generating first netlists based on the behavioral descriptions of the logic chips; receiving connection information of a plurality of non-logic structures, wherein the connection information comprises overall physical arrangement and connectivity among the plurality of logic chips and the plurality of non-logic structures; generating a plurality of virtual interfaces, wherein each of the plurality of virtual interfaces operatively corresponds to an interface between a pair of one of the logic chips and one of the non-logic structures; generating a graph consisting of a plurality of first vertices, a plurality of second vertices, a plurality of third vertices, and a plurality of edges, wherein the first vertices correspond to the logic chips, respectively, the second vertices correspond to the non-logic structures, respectively, and the third vertices correspond to the virtual interfaces, respectively; and transforming the first netlists to a second netlist based on the graph.

In yet another aspect of the present disclosure, a computer program product comprising a computer-readable program medium code stored thereupon is disclosed. The code, when executed by a processor, causes the processor to implement a method. The method includes receiving a behavioral description of each of a plurality of logic chips; generating first netlists based on the behavioral descriptions of the logic chips; receiving connection information of a plurality of non-logic structures, wherein the connection information comprises overall physical arrangement and connectivity among the plurality of logic chips and the plurality of non-logic structures; generating a plurality of virtual interfaces, wherein each of the plurality of virtual interfaces operatively corresponds to an interface between a pair of one of the logic chips and one of the non-logic structures; generating a graph consisting of a plurality of first vertices, a plurality of second vertices, a plurality of third vertices, and a plurality of edges, wherein the first vertices correspond to the logic chips, respectively, the second vertices correspond to the non-logic structures, respectively, and the third vertices correspond to the virtual interfaces, respectively; and transforming the first netlists to a second netlist based on the graph.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit design implementation system, comprising:

a synthesis tool configured to:

receive a behavioral description of each of a plurality of first components;

generate first netlists based on the behavioral descriptions of the first components;

receive connection information of a plurality of second components, wherein the connection information comprises physical arrangement and connectivity among the plurality of first components and the plurality of second components;

generate a plurality of third components, wherein each of the plurality of third components operatively corresponds to an interface between a pair of one of the first components and one of the second components; and transform the first netlists to a second netlist based on a plurality of first vertices, a plurality of second vertices, a plurality of third vertices, and a plurality of edges;

wherein the first vertices correspond to the first components, respectively, the second vertices correspond to the second components, respectively, and the third vertices correspond to the third components, respectively.

2. The system of claim 1, wherein the first components each comprise a physical integrated circuit chip, and the second components each comprise a physical substrate, a physical redistribution layer (RDL), or a physical interposer, while each of the third components is a virtual component.

3. The system of claim 1, wherein the first components each comprise a logic chip, and the second components each comprise a non-logic structure, while each of the third components is a virtual component.

4. The system of claim 1, wherein the plurality of first components and the plurality of second components form a semiconductor package.

5. The system of claim 4, further comprising:

a placement and route tool configured to generate a layout based on the second netlist; and a verification tool configured to provide, based on the layout, a physical verification for the semiconductor package.

6. The system of claim 1, wherein the plurality of edges each connect any two of the first vertices, second vertices, and third vertices.

7. The system of claim 1, wherein the synthesis tool is further configured to receive power information, wherein the power information comprises one or more power/signal delivery paths among the first components and the second components.

8. The system of claim 7, wherein the synthesis tool is further configured to annotate one or more of the first vertices, second vertices, and third vertices based on the one or more power/signal delivery paths.

9. A method for verifying a semiconductor package, comprising:

receiving a behavioral description of each of a plurality of logic chips;

generating first netlists based on the behavioral descriptions of the logic chips;

receiving connection information of a plurality of non-logic structures, wherein the connection information comprises overall physical arrangement and connectivity among the plurality of logic chips and the plurality of non-logic structures;

generating a plurality of virtual interfaces, wherein each of the plurality of virtual interfaces operatively corresponds to an interface between a pair of one of the logic chips and one of the non-logic structures;

generating a graph consisting of a plurality of first vertices, a plurality of second vertices, a plurality of third vertices, and a plurality of edges, wherein the first vertices correspond to the logic chips, respectively, the second vertices correspond to the non-logic structures, respectively, and the third vertices correspond to the virtual interfaces, respectively; and transforming the first netlists to a second netlist based on the graph.

10. The method of claim 9, wherein the non-logic structures each comprise a physical substrate, a physical redistribution layer (RDL), or a physical interposer.

11. The method of claim 9, wherein the plurality of first logic chips and the plurality of non-logic structures form a semiconductor package.

12. The method of claim 11, further comprising:

generating a layout based on the second netlist; and providing, based on the layout, a physical verification for the semiconductor package.

13. The method of claim 9, wherein the plurality of edges each connect any two of the first vertices, second vertices, and third vertices.

14. The method of claim 9, further comprising receiving power information, wherein the power information comprises one or more power/signal delivery paths among the logic chips and the non-logic structures.

15. The method of claim 14, further comprising annotating one or more of the first vertices, second vertices, and third vertices based on the one or more power/signal delivery paths.

16. A computer program product comprising a computer-readable program medium code stored thereupon, the code, when executed by a processor, causing the processor to implement a method, comprising:

receiving a behavioral description of each of a plurality of logic chips;

generating first netlists based on the behavioral descriptions of the logic chips;

receiving connection information of a plurality of non-logic structures, wherein the connection information comprises overall physical arrangement and connectivity among the plurality of logic chips and the plurality of non-logic structures;

generating a plurality of virtual interfaces, wherein each of the plurality of virtual interfaces operatively corresponds to an interface between a pair of one of the logic chips and one of the non-logic structures;

generating a graph consisting of a plurality of first vertices, a plurality of second vertices, a plurality of third vertices, and a plurality of edges, wherein the first vertices correspond to the logic chips, respectively, the second vertices correspond to the non-logic structures, respectively, and the third vertices correspond to the virtual interfaces, respectively; and transforming the first netlists to a second netlist based on the graph.

17. The computer program product according to claim 16, wherein the plurality of logic chips and the plurality of non-logic structures form a semiconductor package.

18. The computer program product according to claim 17, the method further comprising:

generating a layout based on the second netlist; and providing, based on the layout, a physical verification for the semiconductor package.

19. The computer program product according to claim 16, wherein the plurality of edges each connect any two of the first vertices, second vertices, and third vertices.

20. The computer program product according to claim 16, the method further comprising:

receiving power information, wherein the power information comprises one or more power/signal delivery paths among the logic chips and the non-logic structures; and annotating, in the graph, one or more of the first vertices, second vertices, and third vertices based on the one or more power/signal delivery paths.

* * * * *